Nov. 19, 1963 R. N. NOYCE 3,111,590

TRANSISTOR STRUCTURE CONTROLLED BY AN AVALANCHE BARRIER

Filed June 5, 1958

ROBERT N. NOYCE
*INVENTOR.*

BY

Flehr & Swain
ATTORNEYS

United States Patent Office 3,111,590

Patented Nov. 19, 1963

3,111,590

TRANSISTOR STRUCTURE CONTROLLED BY AN AVALANCHE BARRIER

Robert N. Noyce, Los Altos, Calif., assignor, by mesne assignments, to Clevite Corporation, Cleveland, Ohio, a corporation of Ohio Filed June 5, 1958, Ser. No. 740,120
5 Claims. (Cl. 307—88.5)

This invention relates generally to a junction semiconductive device.

It is a general object of the present invention to provide a semiconductive device having symmetrical base and emitter electrodes.

It is another object of the present invention to provide a semiconductive device which may be used in direct coupled circuits and switching circuits.

It is another object of the present invention to provide a semiconductive device which includes a built-in voltage breakdown region and an amplifying region.

It is another object of the present invention to provide a 3-layer, 3-terminal device in which the emitter-base contacts are symmetrically disposed.

It is still another object of the present invention to provide a semiconductive device which includes an emitter junction having its bias controlled by an avalanche breakdown region of the device.

These and other objects of the invention will become more clearly apparent from the following description when taken in conjunction with the accompanying drawings.

Referring to the drawing.

Figures 1, 2, 3, 4, 5, 6, 7:
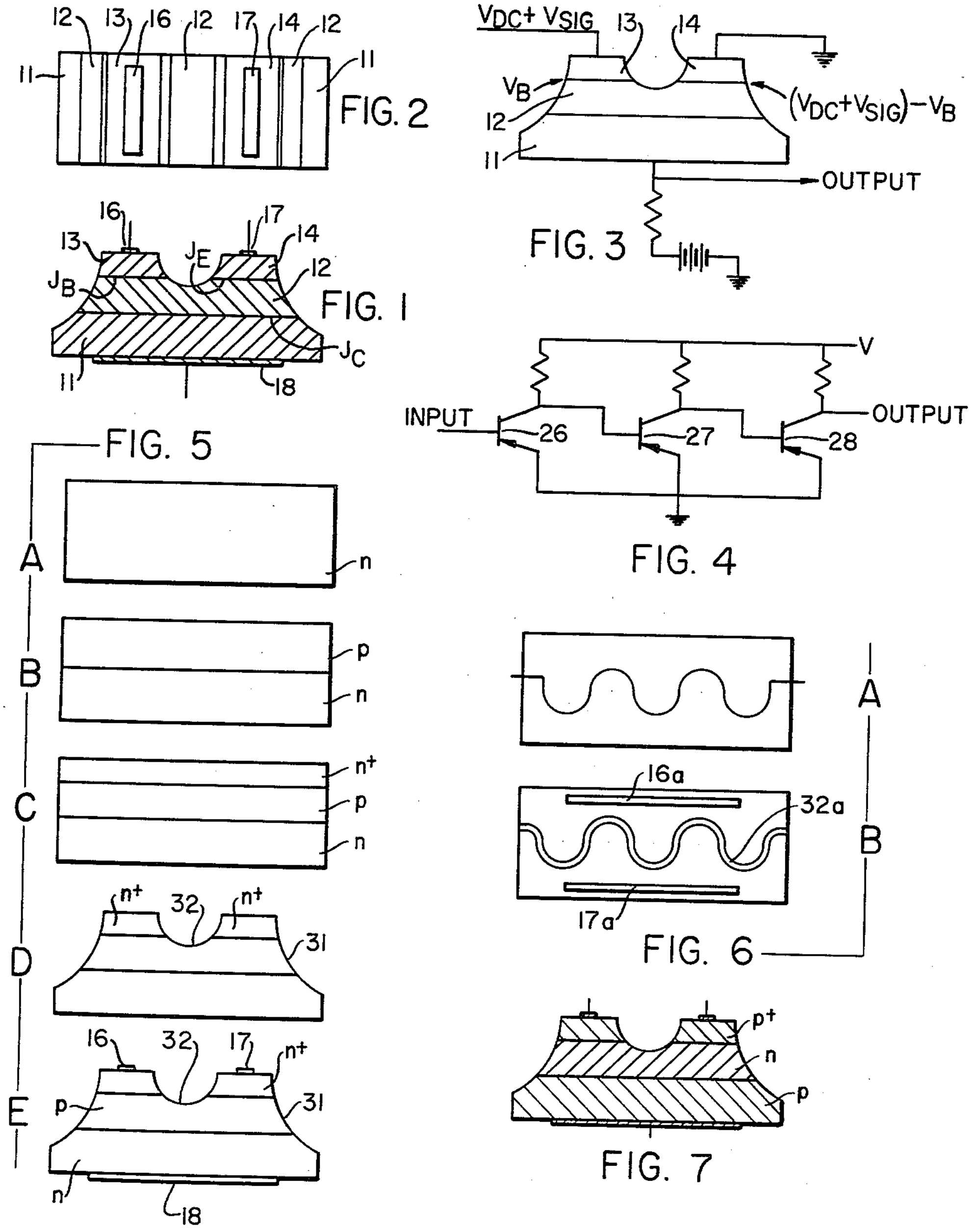
FIGURE 1 is a sectional view showing the device of the invention.
FIGURE 2 is a plan view of the device of FIGURE 1.
FIGURE 3 shows a circuit incorporating the device.
FIGURE 4 shows a multi-stage direct coupled amplifier circuit incorporating the device.

FIGURES 5A–E show the steps which may be followed in constructing a device in accordance with the invention;

FIGURES 6A–B show the steps which may be followed in constructing another device in accordance with the invention; and FIGURE 7 shows a device similar to that of FIGURE 1 but in which the conductivity types have been reversed.

Generally, the device of the present invention operates with an avalanche breakdown region controlling the bias across an emitter junction.

Referring to FIGURE 1, the device illustrated comprises an n-type collector region 11, a p-type base region 12 forming a collector junction $J_C$ therewith, and n-type regions 13 and 14 forming a breakown junction $J_B$ and an emitter junction $J_E$ with the base region 12. Suitable ohmic contacts 16 and 17 are made to the regions 13 and 14, and a collector contact 18 is made to the region 11. The contacts 16 and 17 serve as the base and emitter connections as will be presently described. As shown in FIGURE 2, the device may include relatively long rectilinear contacts 16 and 17. Manufacture of a device of the type described with reference to FIGURES 1 and 2 will be presently explained.

In many applications, for example, in direct coupled circuits, the signal to be amplified is at a D.-C. voltage above ground. It becomes necessary to supply suitable bias sources or to otherwise step down the voltage, or to provide separate power supplies for each stage of the multi-stage network.

In the present device, the signal is applied to one of the connections 16 or 17; in the example illustrated, the input signal is shown applied to the terminal 16 and is represented by $V_{dc}+V_{sig}$. The $V_{dc}$ refers to the D.-C.

voltage level of the input signal, and the $V_{sig}$ refers to the input signal. The junction $J_B$ is formed to operate as an avalanche or breakdown junction. It serves to give a relatively fixed voltage drop represented by $V_B$.

The voltage appearing across the junction $J_E$ will be equal to the applied signal less the breakdown voltage or $(V_{dc}+V_{sig})-V_B$. A device may be constructed with a breakdown voltage $V_B$ at the junction $J_B$ of any predetermined value by the addition of impurities (donors and acceptors) to control the concentration gradient at the junction. Thus, the junction $J_E$ has a forward bias which causes the emission of carriers into the base layer 12, which carriers are carried across to the collector junction in a manner well known in the transistor art.

Thus, the left-hand portion of the device acts as an avalanche diode serving to adjust the D.-C. voltage level, while the right-hand portion of the device acts as a conventional 3-layer transistor serving to amplify the signal $V_{sig}$.

Referring to FIGURE 4, a 3-stage D.-C. coupled amplifier employing devices in accordance with the invention is illustrated. A grounded emitter configuration is shown. The input signal is applied to the base of the first transistor 26, the amplified signal is then applied to the base of the transistor 27 which corresponds to the lead 16. The amplified signal which appears at the collector is applied to the second stage including the transistor 27 and to a third stage including the transistor 28. It is observed that biasing sources, and separate power supplies are not required. The base of the various transistors 26, 27 and 28 are operated at avalanche voltage above ground.

Referring to FIGURE 5, the steps in manufacturing a device in accordance with the invention are schematically illustrated. FIGURE 5A shows a starting block of semiconductive material which may be of either conductivity type. In the example to follow, it is assumed the block is of n-type material. A layer of semiconductive material of opposite conductivity type, p-type, is then formed on the block as shown in FIGURE 5B. Diffusion processes for forming layers of suitable thickness and doping concentration are well known in the art and will not be described in detail. Referring to FIGURE 5C, the device of FIGURE 5B is shown after a subsequent diffusion in the presence of donor atoms whereby an n+ type layer is formed. Preferably, the doping in the upper layer is heavier than the doping in the collector or main block whereby avalanche action takes place and whereby the emission efficiency is increased.

The next step is a masking step in which the upper surface of the device is masked. The device is then subjected to an etchant cutting away the edge portions as shown at 31, and to form a channel or groove 32 which separates the upper n+ region. Contact is then made to the two regions 13 and 14 and to the collector region.

The device in accordance with the invention lends itself nicely to manufacture of interdigital structures of the type shown in FIGURES 6A and 6B. The upper surface of a device which has been subjected to diffusion to give the structure of FIGURE 5C is masked by a wire or other suitable mask and acid resist is applied to the surface. The block is then subjected to an etching solution to form a zigzag channel 32a of the type shown in FIGURE 6B. Contacts 16a and 17a are made to the symmetrical regions with a base contact being made to the collector region.

It is apparent that although a n-p-n type of structure has been illustrated and described, that p-n-p types of structures are encompassed within the spirit of this invention. Referring particularly to FIGURE 7, such a structure is illustrated.

Thus, it is seen that a semiconductive device having a symmetrical emitter-base structure and a built-in avalanche junction is provided. The structure is suitable for switching applications and for direct coupled amplifiers.

I claim:

1. A semiconductive device comprising a first layer of one conductivity type forming a collector region, a second layer of opposite conductivity type forming a base region, one surface of said second layer forming a collector junction with the first layer, a pair of symmetrical spaced regions of the same conductivity type forming junctions with the other surface of said base region, emitter contact made to one of said last named regions, and a base contact made to the other of said regions, said base contact including an avalanche junction formed between said other region and the base region in series between it and the base region, and a collector contact made to the collector region.

2. A semiconductive device comprising a collector region of one conductivity type, a base region of opposite conductivity type having one surface forming a rectifying junction therewith, and first and second spaced regions of the same conductivity type forming first and second junctions with the other surface of the base region, one of said last named junctions serving as an emitter junction and the other of said last named junctions serving as an avalanche junction.

3. A semiconductive device comprising a collector region of one conductivity type, means forming a collector contact with said region, a base region of opposite conductivity type forming a rectifying junction therewith, first and second spaced regions of the same conductivity type forming first and second junctions with said base region, one of said last named junctions serving as an emitter junction and the other of said last named junctions serving as an avalanche junction, a base contact made to the region forming the avalanche junction and an emitter contact made to the region forming the emitter junction.

4. A semiconductive device comprising a first layer of one conductivity type, a second layer of opposite conductivity type forming a base region, said first and second layers forming a collector junction and first and second spaced regions of said one conductivity type forming junctions with said base region, a portion of said device including the first spaced region being connected to operate as an avalanche diode, and a portion of said device including the second spaced region connected to operate as a transistor.

5. A semiconductive device comprising a first layer of one conductivity type forming a collector region, a second layer of opposite conductivity type forming a base region, said first and second layers cooperating to form a collector junction, third and fourth spaced regions of said one conductivity type each forming a junction with the base layer, means for making base contact to one of said third and fourth layers, means for biasing one of said layers including the base contact to provide avalanche breakdown at the junction whereby the connection to the base layer includes the avalanche voltage drop in series therewith, means for making emitter contact to the other of said third and fourth layers, means for biasing the junction formed with said emitter layer to inject carriers into the base layer, and means for reverse biasing the collector junction whereby the collector collects the injected carriers.

References Cited in the file of this patent

UNITED STATES PATENTS

| | | |
|---|---|---|
| 2,742,383 | Barnes et al. | Apr. 17, 1956 |
| 2,757,323 | Jordan et al. | July 31, 1956 |
| 2,778,885 | Shockley | Jan. 22, 1957 |
| 2,779,877 | Lehovec | Jan. 29, 1957 |
| 2,837,704 | Emeis | June 6, 1958 |
| 2,859,286 | Kennedy | Nov. 4, 1958 |
| 2,910,634 | Rutz | Oct. 27, 1959 |
| 2,910,653 | Pritchard | Oct. 27, 1959 |
| 2,915,647 | Ebers et al. | Dec. 1, 1959 |
| 2,936,384 | White | May 10, 1960 |